(12) United States Patent
Qin et al.

(10) Patent No.: US 10,725,347 B2
(45) Date of Patent: Jul. 28, 2020

(54) ARRAY SUBSTRATE AND DISPLAY DEVICE

(71) Applicant: BOE TECHNOLOGY GROUP CO., LTD., Beijing (CN)

(72) Inventors: Yunke Qin, Beijing (CN); Xue Dong, Beijing (CN); Haisheng Wang, Beijing (CN); Yingming Liu, Beijing (CN); Lijun Zhao, Beijing (CN); Rui Xu, Beijinb (CN); Yuzhen Guo, Beijing (CN); Pinchao Gu, Beijing (CN); Ping Zhang, Beijing (CN); Yanan Jia, Beijing (CN); Changfeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/135,431

(22) Filed: Sep. 19, 2018

(65) Prior Publication Data

US 2019/0146283 A1    May 16, 2019

(30) Foreign Application Priority Data

Sep. 15, 2017   (CN) .......................... 2017 1 0835118

(51) Int. Cl.
*G06F 3/042*      (2006.01)
*G02F 1/1343*     (2006.01)
(Continued)

(52) U.S. Cl.
CPC ...... *G02F 1/134309* (2013.01); *G02F 1/1336* (2013.01); *G02F 1/1337* (2013.01);
(Continued)

(58) Field of Classification Search
CPC ...... G06F 3/0325; G06F 3/042; G06F 3/0421; G06F 3/0425; H04N 13/20; H04N 13/204; H04N 13/207
See application file for complete search history.

(56) References Cited

U.S. PATENT DOCUMENTS

2008/0122803 A1*  5/2008  Izadi .................... G06F 3/0421
                                                                    345/175
2012/0262556 A1   10/2012  Kuwahara et al.
(Continued)

FOREIGN PATENT DOCUMENTS

CN          1414420 A       4/2003
CN          106664354 A     5/2017

OTHER PUBLICATIONS

First Office Action for Chinese Patent Application No. 201710835118.X dated Oct. 28, 2019.

*Primary Examiner* — Dennis P Joseph
(74) *Attorney, Agent, or Firm* — Calfee, Halter & Griswold LLP

(57) ABSTRACT

Embodiments of the present disclosure provide an array substrate and a display device. The array substrate includes a three-dimensional imaging device configured to acquire three-dimensional imaging information of a target object; and a processing circuit connected to the three-dimensional imaging device and configured to receive three-dimensional imaging information from the three-dimensional imaging device and generate a three-dimensional image of the target object based on the three-dimensional imaging information.

12 Claims, 4 Drawing Sheets

(51) Int. Cl.
*G02F 1/1339* (2006.01)
*G02F 1/1335* (2006.01)
*H04N 13/207* (2018.01)
*H04N 13/106* (2018.01)
*H01L 27/12* (2006.01)
*G02F 1/13357* (2006.01)
*G02F 1/1337* (2006.01)
*H04N 13/30* (2018.01)
*H04N 13/254* (2018.01)
*H01L 27/146* (2006.01)

(52) U.S. Cl.
CPC ...... *G02F 1/1339* (2013.01); *G02F 1/133512* (2013.01); *G02F 1/133514* (2013.01); *H01L 27/1214* (2013.01); *H04N 13/106* (2018.05); *H04N 13/207* (2018.05); *H04N 13/254* (2018.05); *H04N 13/30* (2018.05); *H01L 27/14643* (2013.01)

(56) References Cited

U.S. PATENT DOCUMENTS

| | | | |
|---|---|---|---|
| 2012/0312962 A1* | 12/2012 | Hebert | G06F 3/04883 250/206.1 |
| 2016/0182846 A1* | 6/2016 | Wan | H04N 5/3765 348/302 |
| 2018/0084238 A1* | 3/2018 | Chossat | H04N 13/207 |
| 2019/0004667 A1* | 1/2019 | Barth | G06F 3/0418 |

* cited by examiner

ARRAY SUBSTRATE AND DISPLAY DEVICE

RELATED APPLICATION

The present application claims the benefit of Chinese Patent Application No. 201710835118.X, filed on Sep. 15, 2017, the entire disclosure of which is incorporated herein by reference.

FIELD

The present disclosure relates to the field of display, and specifically to an array substrate and a display device.

BACKGROUND

With the continuous development of display technologies, display devices (such as displays) have increasingly more functions. The original display devices only had a display function and displayed a black and white image. The current display devices not only display a colorful image but have also become more intelligent. For example, in a current touch-screen mobile phone, a user can operate and control related functions of the mobile phone by touching the screen, which provides convenience for the user's operation.

At the present, the functions of three-dimensional imaging and gesture recognition have received extensive attention. For example, in a VR (Virtual Reality) game, by recognizing or tracking changes in a user's gestures, and simulating the user's hand into a three-dimensional image to be displayed in a virtual scene, the user can intuitively participate in the game, thereby bringing fun to the user.

SUMMARY

An aspect of the present disclosure provides an array substrate comprising: a three-dimensional imaging device configured to acquire three-dimensional imaging information of a target object; and a processing circuit connected to the three-dimensional imaging device and configured to receive the three-dimensional imaging information from the three-dimensional imaging device, and generate a three-dimensional image of the target object based on the three-dimensional imaging information.

According to some embodiments of the present disclosure, the three-dimensional imaging device comprises an image sensor, a light source, and a photodetector. The light source is configured to emit light of a preset wavelength to illuminate the target object. The image sensor is configured to sense light reflected back by the target object and generate two-dimensional image information based on sensed light. The photodetector is configured to receive light reflected back by the target object and generate a second electrical signal based on received light. The processing circuit is configured to instruct the light source to emit light of the preset wavelength, receive the two-dimensional image information and the second electrical signal from the image sensor and the photodetector respectively, determine depth information of the target object based on time at which the light is emitted and time at which the second electrical signal is received, and generate the three-dimensional image based on the depth information and the two-dimensional image information.

According to some embodiments of the present disclosure, the preset wavelength ranges from about 760 nm to 1 mm.

According to some embodiments of the present disclosure, the processing circuit is configured to transmit a first electrical signal to the light source, and the light source is configured to emit light of the preset wavelength in response to receiving the first electrical signal.

According to some embodiments of the present disclosure, the depth information of the target object is $c(T-t_1-t_2)/2$, where c is a propagation speed of light, T is a time interval from transmission of the first electrical signal to reception of the second electrical signal by the processing circuit, $t_1$ is a time interval from reception of the first electrical signal to emission of light of the preset wavelength by the light source, and $t_2$ is a time interval from reception of the light reflected back by the target object to output of the second electrical signal by the photodetector.

According to some embodiments of the present disclosure, the light source is disposed between the image sensor and the photodetector in a direction parallel to the array substrate.

According to some embodiments of the present disclosure, distances between the light source, the image sensor, and the photodetector are within a set range.

Another aspect of the present disclosure provides a display device comprising any of the array substrates described above.

According to some embodiments of the present disclosure, the display device further comprises a first electrode, a liquid crystal layer, and a second electrode. The first electrode is disposed on a side of the liquid crystal layer away from the array substrate, and the second electrode is disposed between the liquid crystal layer and the array substrate.

According to some embodiments of the present disclosure, the three-dimensional imaging device comprises an image sensor, a light source and a photodetector. The light source is configured to emit light of a preset wavelength to illuminate the target object. The image sensor is configured to sense light reflected back by the target object and generate two-dimensional image information based on sensed light. The photodetector is configured to receive light reflected back by the target object and generate a second electrical signal based on received light. The processing circuit is configured to instruct the light source to emit light of the preset wavelength, receive the two-dimensional image information and the second electrical signal from the image sensor and the photodetector respectively, determine depth information of the target object based on time at which the light is emitted and time at which the second electrical signal is received, and generate the three-dimensional image based on the depth information and the two-dimensional image information. The liquid crystal layer includes a plurality of first liquid crystal regions, and orthographic projections of the plurality of first liquid crystal regions on the array substrate at least partially cover the image sensor, the light source or the photodetector.

According to some embodiments of the present disclosure, the display device further comprises spacers disposed between the plurality of first liquid crystal regions.

According to some embodiments of the present disclosure, the display device comprises a plurality of sub-pixels, wherein each of the plurality of sub-pixels includes a second liquid crystal region, and the display device further comprises a spacer disposed between adjacent first liquid crystal region and second liquid crystal region.

According to some embodiments of the present disclosure, the display device further comprises an upper alignment film and a lower alignment film.

According to some embodiments of the present disclosure, the upper alignment film is between the first electrode and the liquid crystal layer.

According to some embodiments of the present disclosure, the lower alignment film is between the second electrode and the liquid crystal layer.

According to some embodiments of the present disclosure, the second electrode is disposed in the lower alignment film.

According to some embodiments of the present disclosure, the first electrode is a strip electrode, and the first electrode is disposed in the upper alignment film.

According to some embodiments of the present disclosure, the display device further comprises a color film. The color film is disposed on a side of the first electrode away from the liquid crystal layer, and includes a black matrix. The three-dimensional imaging device and the processing circuit are disposed in a display area. An orthographic projection of the black matrix on the array substrate at least partially overlaps the three-dimensional imaging device. The black matrix has a light-transmissive hole, and an orthographic projection of the light-transmissive hole on the array substrate at least partially overlaps the three-dimensional imaging device.

According to some embodiments of the present disclosure, the three-dimensional imaging device is disposed in a non-display area on periphery of a display area of the display device.

According to some embodiments of the present disclosure, the display device further comprises a substrate, a sealant and a protective layer. The substrate is disposed on a side of the first electrode away from the liquid crystal layer. The sealant is disposed on two sides of the liquid crystal layer in a direction parallel to the array substrate. The protective layer is disposed between the second electrode and the array substrate and configured to protect the array substrate.

Additional aspects and advantages of the present disclosure will be partly presented in the description below, which will become apparent from the description below or be appreciated in practicing of the present disclosure.

BRIEF DESCRIPTION OF THE DRAWINGS

The above and/or additional aspects and advantages of the present disclosure will become apparent and readily understood from the description of embodiments with reference to the drawings below, wherein.

DETAILED DESCRIPTION

Figure 1:
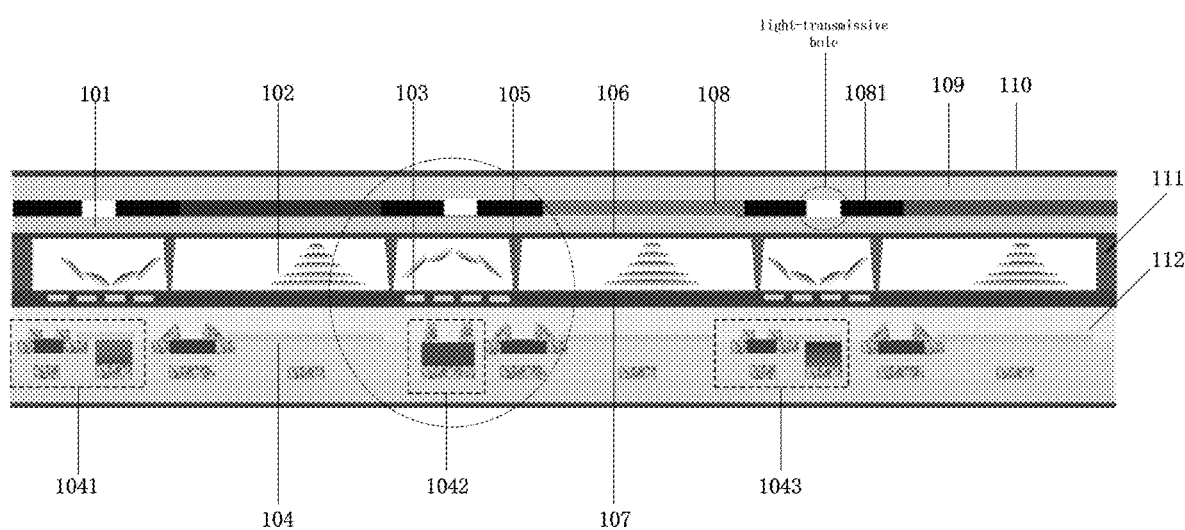
FIG. 1 is a schematic structural view of a display device provided by an embodiment of the present disclosure.

Embodiments of the present disclosure are described in detail below, and examples of the embodiments are illustrated in the drawings, wherein the same or similar reference numerals are used to refer to the same or similar elements or elements having the same or similar functions. Embodiments described below with reference to the accompanying drawings are illustrative, which are only used for explaining the present disclosure, rather than limiting it.

Those skilled in the art will understand that the singular forms "a", "an", "the" and "said" used herein are intended to also include plural forms, unless particularly specified. It is to be further understood that the term "comprising" used in the specification indicates the presence of a feature, entirety, step, operation, element and/or component, but does not exclude the presence or addition of one or more other features, entireties, steps, operations, elements, components, and/or groups. It will be understood that when an element is referred to being "connected" or "coupled" to another element, it may be directly connected or coupled to the other element, or there may also be an intermediate element. Further, "connected" or "coupled" used herein may include either a wireless connection or a wireless coupling. The term "and/or" used herein includes all or any of the associated items listed and all combinations thereof.

Those skilled in the art will appreciate that all the terms (including technical and scientific terms) used herein have the same meanings as commonly understood by a person having ordinary skill in the art to which the present disclosure pertains, unless otherwise defined. It will be further understood that terms such as those defined in commonly used dictionaries should be interpreted as having meanings consistent with their meanings in the context of the prior art, and will not be explained in an idealized or too formal sense, unless specifically defined herein.

The inventors of the present disclosure have found that at present, the functions of three-dimensional imaging and gesture recognition are not applied to smart display devices. For example, most touch-screen mobile phones can only receive control signals sent by a user by touching the screen, but cannot perform corresponding functions according to changes in the user's gestures.

Therefore, there is a need in the art for a display device that can perform not only three-dimensional imaging according to a real object but also corresponding functions according to changes in a user's gestures.

In view of this, an embodiment of the present disclosure provides an array substrate comprising a three-dimensional imaging device configured to acquire three-dimensional imaging information of a target object. The array substrate further comprises a processing circuit connected to the three-dimensional imaging device, which is configured to receive three-dimensional imaging information from the three-dimensional imaging device and generate a three-dimensional image of the target object based on the three-dimensional imaging information.

Further, an embodiment of the present disclosure provides a display device, and a schematic structural view of the display device is shown in FIG. 1. The display device comprises a first electrode 101, a liquid crystal layer 102, a second electrode 103, and an array substrate 104. The first electrode 101 is disposed on a side of the liquid crystal layer 102 away from the array substrate 104, and the second electrode 103 is disposed between the liquid crystal layer 102 and the array substrate 104. Orthographic projections of a plurality of first liquid crystal regions in the liquid crystal layer 102 on the array substrate 104 at least partially cover an image sensor 1041, a light source (e.g. a light emitting diode) 1042 and a photodetector 1043 in the array substrate 104, respectively. In other words, the image sensor 1041, the light source 1042, and the photodetector 1043 in the array substrate 104 are exactly opposite corresponding first liquid crystal regions, respectively. The second electrode 103 and the first electrode 101 are configured to cooperate with each other to deflect the plurality of first liquid crystal regions.

In an embodiment of the present disclosure, as shown in FIG. 1, the array substrate 104 comprises a three-dimensional imaging device and a processing circuit connected to the three-dimensional imaging device. The three-dimensional imaging device comprises an image sensor 1041, a light source 1042, and a photodetector 1043. The light source 1042 is configured to emit light of a preset wavelength to illuminate a target object. The image sensor 1041 is configured to sense light reflected back by the target object and generate two-dimensional image information based on sensed light. The photodetector 1043 is configured to receive light reflected back by the target object and output an electrical signal based on received light. The processing circuit is configured to receive the two-dimensional image information and the electrical signal from the image sensor 1041 and the photodetector 1043 respectively, determine depth information of the target object based on time at which the light is emitted and time at which the electrical signal is received, and determine a three-dimensional image based on the depth information and the two-dimensional image information.

As used herein, the image sensor 1041, the light source 1042, and the photodetector 1043 may collectively be referred to as a three-dimensional imaging device, and the two-dimensional image information and the electrical signal may collectively be referred to as three-dimensional imaging information.

In the array substrate and the display device provided by embodiments of the present disclosure, it is required to acquire a three-dimensional image of a target object (e.g. a user's hand). Therefore, before explaining the structure of the display device provided by an embodiment of the present disclosure in detail, the principle of acquiring a three-dimensional image in embodiments of the present disclosure will be first described with reference to FIG. 2.

Figure 2:
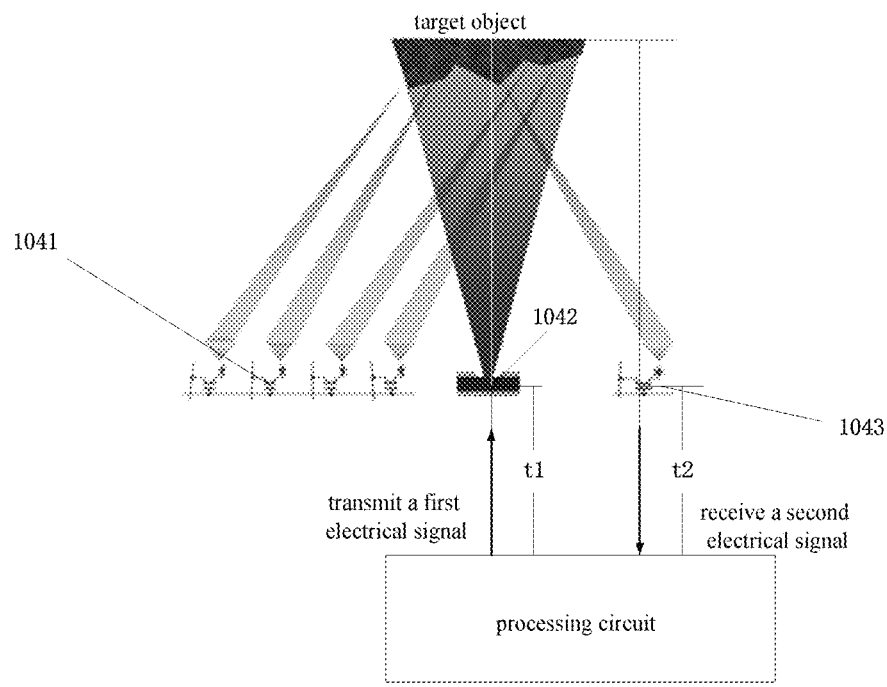
FIG. 2 is a schematic view illustrating the principle of acquiring a three-dimensional image of a target object according to an embodiment of the present disclosure.

As shown in FIG. 2, firstly, the processing circuit outputs a first electrical signal to the light source 1042. The light source 1042 emits light of a preset wavelength in response to receiving the first electrical signal. In an exemplary embodiment, the light is specifically infrared light having a wavelength in the range of 760 nm (nanometer) to 1 mm (millimeter). The light emitted by the light source 1042 illuminates a target object and then reflected back by the target object. The image sensor 1041 receives reflected light and obtains two-dimensional image information of the target object by data processing based on the received light. The photodetector 1043 outputs a second electrical signal to the processing circuit in response to receiving the reflected light. The processing circuit determines depth information of the target object based on the time at which the first electrical signal is transmitted and the time at which the second electrical signal is received.

It is to be noted that the processing circuit for transmitting the first electrical signal and the processing circuit for receiving the second electrical signal may be the same processing circuit or different processing circuits, which are not specifically limited in the present disclosure. In order to clearly illustrate embodiments of the present disclosure, the concept of the present disclosure is explained based an example in which the two processing circuits are the same processing circuit.

Specifically, in an exemplary embodiment, a specific method for acquiring the depth information may be: calculating a sum of the distance from the light source to the target object and the distance from the target object to the photodetector according to the light speed and a time interval (light propagation time) from emission of light by the light source to reception of light by the photodetector, thereby determining the depth information of the target object.

In practical applications, it takes time for the light source to proceed to emission of light of a preset wavelength from reception of the first electrical signal, and it also takes time for the photodetector to proceed to output of the second electrical signal from reception of light reflected back by the target object. Since the order of magnitude of the light speed is large, if the time interval from the output of the first electrical signal to the reception of the second electrical signal by the processing circuit is directly taken as the light propagation time when the depth information of the target object is being calculated, as a result, compared to the reality, the calculated sum of the distance from the light source to the target object and the distance from the target object to the photodetector may involve a large error, which in turn results in a large error in the acquired depth information of the target object.

In view of this, in order to reduce the error, at the time of calculating the light propagation time, it is possible to subtract the time interval from reception of the first electrical signal to emission of light of a preset wavelength by the light source and the time interval from reception of the light reflected back by the target object to output of the second electrical signal by the photodetector from the time interval from output of the first electrical signal to reception of the second electrical signal by the processing circuit. As shown in FIG. 2, it is assumed that the time interval from transmission of the first electrical signal to reception of the second electrical signal by the processing circuit is T, the time interval from reception of the first electrical signal to emission of light of a preset wavelength by the light source 1042 is t1, and the time interval from reception of the light reflected back by the target object to output of the second electrical signal by the photodetector 1043 is t2, the light propagation time is T−t1−t2.

For embodiments of the present disclosure, the image sensor, the light source and the photodetector are all disposed on the array substrate 104, and the distance between one another is very small, which is usually tens of microns. Therefore, the angle between the light emitted by the light source 1042 to the target object and the light reflected by the target object to the photodetector 1043 is negligible. That is, it may be understood as that the light backtracks to the photodetector 1043 after encountering the target object. Namely, the positions of the photodetector 1043 and the light source 1042 are defaulted to approximately coincide with each other. In addition, in practical applications, considering the feasibility of the display device acquiring the image information of the target object, the distance between the target object and the display device will not be too great, and therefore, the loss of energy of light during propagation in the air can be ignored. Thus, the calculated sum of the distance from the light source 1042 to the target object and the distance from the target object to the photodetector 1043 can be directly divided by 2, which is the depth information of the target object. Using the above example, the calculated depth information of the target object is c(T−t1−t2)/2, where c is a propagation speed of light.

After obtaining the two-dimensional image information and the depth information of the target object, a three-dimensional image of the target object can be obtained by data processing.

Figure 3:
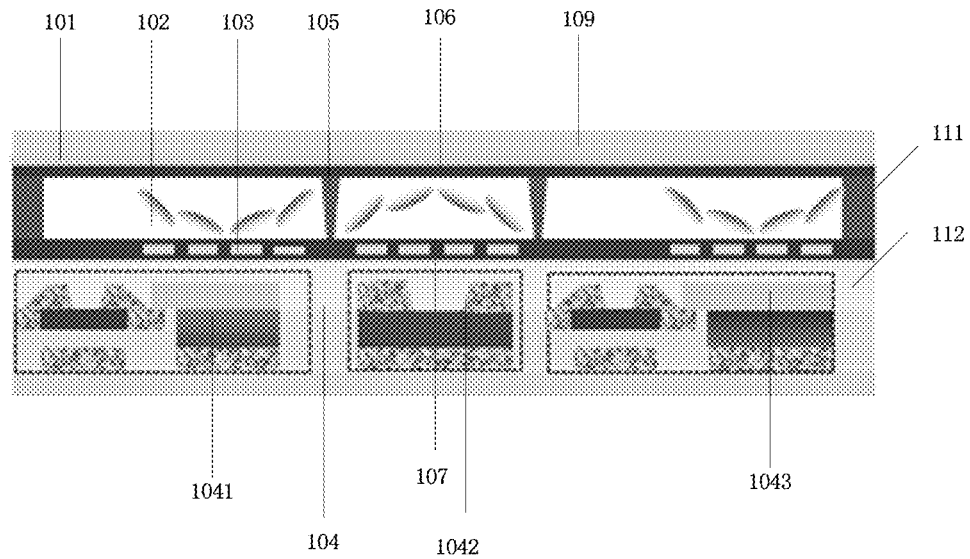
FIG. 3 is a schematic structural view of another display device provided by an embodiment of the present disclosure.

In practical applications, the image sensor, the light source, and the photodetector (collectively referred to as a three-dimensional imaging device) provided by embodiments of the present disclosure may be disposed in a display area, i.e. a light-emitting area, of the display device, as shown in FIG. 1. The three-dimensional imaging device may also be disposed in a non-display area as shown in FIG. 3. For example, the three-dimensional imaging device may be disposed in a bezel portion of the display device, and may be specifically disposed at a position where a camera, an earpiece or a main control button is located on the bezel.

In an exemplary embodiment, as shown in FIG. 1, in the display area of the display device, spacers 105 are disposed between the first liquid crystal regions exactly opposite the image sensor 1041, the light source 1042 and the photodetector 1043, respectively. As shown in FIG. 1, spacers 105 are provided between all the first liquid crystal regions exactly opposite the image sensor 1041, the light source 1042, and the photodetector 1043.

Figure 4:
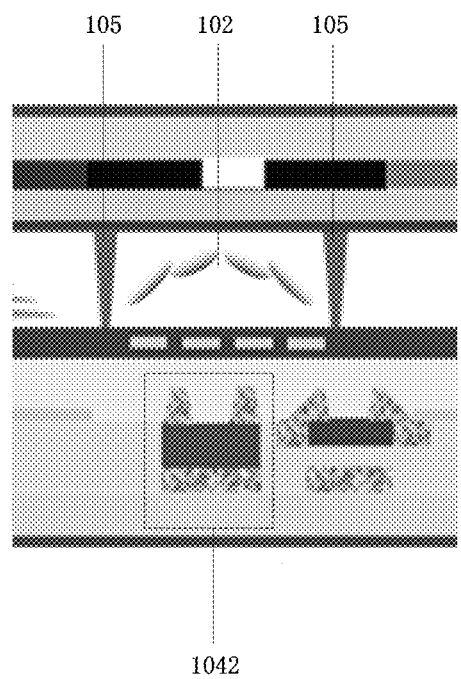
FIG. 4 is a partial enlarged view of the circled portion in FIG. 1.

FIG. 4 is a partial enlarged view of the circled portion of FIG. 1. As shown in FIG. 4, a spacer 105 is disposed between the first liquid crystal regions 102 exactly opposite the light source 1042.

In an exemplary embodiment, when the three-dimensional imaging device is disposed in a non-display area of the display device, spacers are disposed between the first liquid crystal regions exactly opposite the image sensor, the light source, and the photodetector, respectively, as shown in FIG. 3.

In the foregoing embodiments of the present disclosure, as can be obtained from the principle of acquiring a three-dimensional image according to the present disclosure as described above, light propagation is carried out in all the first liquid crystal regions corresponding to the image sensor, the light source, and the photodetector in the process of acquiring a three-dimensional image of the target object. Specifically, the light source needs to emit light, both the image sensor and the photodetector need to receive the reflected light, and the light needs to propagate in all the first liquid crystal regions corresponding to the three devices. Since the distances between the three devices are relatively small, the light in the first liquid crystal regions corresponding to the three devices are easily mixed, so that errors are generated in the data measured by the three devices. Therefore, by providing spacers between the first liquid crystal regions corresponding to the three devices, it can be ensured that light of the first liquid crystal region corresponding to each device independently propagates, so that light in the respective regions does not affect each other. As a result, the measured data is more accurate, which in turn makes the acquired three-dimensional image more precise. Further, by separating the first liquid crystal regions corresponding to the image sensor, the light source and the photodetector from the second liquid crystal regions corresponding to sub-pixels for displaying an image, it can be ensured that the two functions of acquiring a three-dimensional image and display an image are performed independently, without interfering with each other.

As shown in FIG. 1 or FIG. 2, in an exemplary embodiment, the display device further comprises an upper alignment film 106 and a lower alignment film 107. The upper alignment film 106 is located between the first electrode 101 and the liquid crystal layer 102. The lower alignment film 107 is located between the second electrode 103 and the liquid crystal layer 102, or the second electrode 103 is disposed in the lower alignment film 107.

Figure 5:
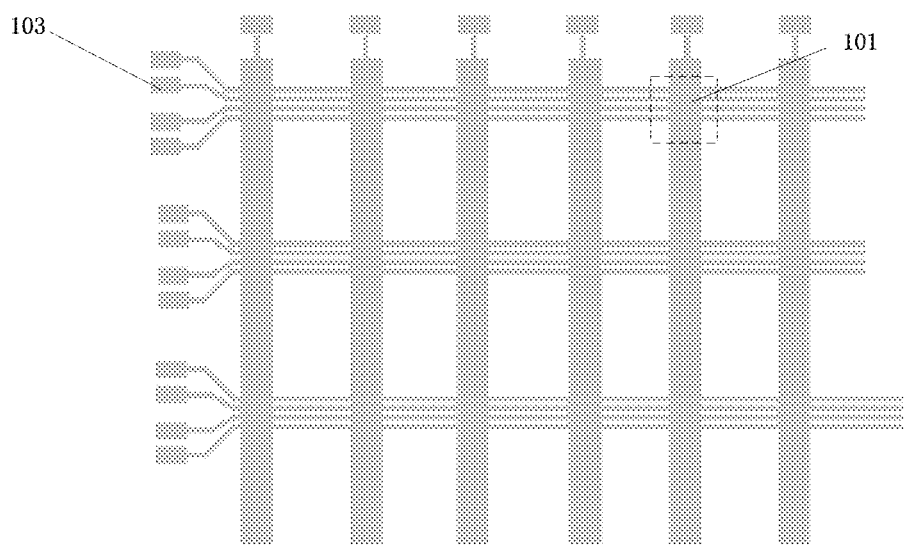
FIG. 5 is a schematic view illustrating a first electrode and a second electrode in a display device provided by an embodiment of the present disclosure.

The first electrode in embodiments of the present disclosure may be a planar electrode or a strip electrode. In an exemplary embodiment, when the first electrode is a strip electrode, the first electrode may be disposed in the upper alignment film. In practical applications, in order to avoid affecting the display effect of the display device and the propagation of light between the three-dimensional imaging device and the target object, the first electrode may specifically be a transparent electrode. The second electrode includes a plurality of electrode groups, each of which includes a plurality of strip electrodes, such as the second electrode 103 in FIG. 1 or FIG. 2. Further, as shown in FIG. 5, the first electrode 101 is a planar electrode, and a portion where the first electrode 101 and the second electrode 103 overlap is a control region as shown by a dashed block in FIG. 5. A deflection direction (deflection angle) of liquid crystal molecules can be adjusted by adjusting a voltage of the control region (i.e. a voltage between the first electrode 101 and the second electrode 103).

Specifically, since light propagation is carried out in all the liquid crystal regions corresponding to the image sensor, the light source and the photodetector, regardless of whether the image sensor, the light source and the photodetector are disposed in the display area or disposed in the non-display area, it is necessary to adjust the voltage between the first electrode and the second electrode to adjust the deflection direction of the liquid crystal molecules in the liquid crystal regions corresponding to the three devices, so that light can be sufficiently transmitted through the liquid crystal molecules to reach the target object or device.

The deflection angle of the liquid crystal molecules and the corresponding voltage between the first electrode and the second electrode which need to be specifically adjusted depend on actual conditions, which are not specifically limited in embodiments of the present disclosure. In an exemplary embodiment, the first electrode employs a strip structure, so that the deflection angle of the liquid crystal molecules in the liquid crystal regions corresponding to the three devices can be controlled at a single point.

Further, as shown in FIG. 1, the display area of the display device further includes a color film 108. The color film 108 is disposed on a side of the first electrode 101 away from the liquid crystal layer 102. When the image sensor 1041, the light source 1042, the photodetector 1043, and the processing circuit are disposed in the display area, the positions of the image sensor 1041, the light source 1042 and the photodetector 1043 on the array substrate 104 at least partially overlap an orthographic projection of the black matrix 1081 in the color film 108 on the array substrate 104, and the black matrix 1081 includes a light transmissive hole.

Specifically, the color film includes regions corresponding to different sub-pixels, and is provided with a black matrix between the regions corresponding to different sub-pixels. In an embodiment of the present disclosure, in order to reduce the influence on the display effect of the display device, the positions of the image sensor, the light source and the photodetector on the array substrate at least partially overlap the orthographic projection of the black matrix in the color film on the array substrate. That is, the three devices are placed in non-light emitting regions between the sub-pixels to avoid occupying the display area of the sub-pixels, which ensures that the aperture ratio is not influenced and avoids affecting the display effect of the light emitting regions.

Figure 6:
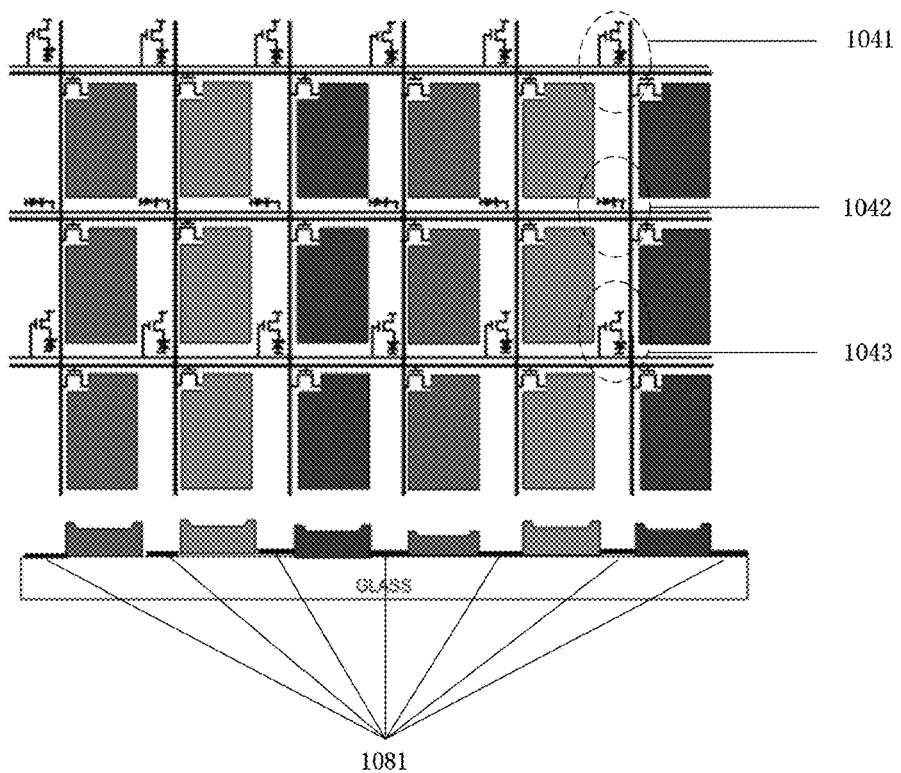
FIG. 6 is a schematic view illustrating an arrangement of an image sensor, a light source and a photodetector provided by an embodiment of the present disclosure.

Specifically, as shown in FIG. 6, the image sensor 1041, the light source 1042 and the photodetector 1043 are placed in regions of the array substrate exactly opposite the black matrix 1081 between the sub-pixels in the display device. In addition, since the black matrix is opaque, in order to ensure the function of acquiring a three-dimensional image, a light-transmissive hole is provided in the black matrix corresponding to the three devices to facilitate the propagation of light, as shown in FIG. 1.

As shown in FIG. 1 and FIG. 3, the display device provided by an embodiment of the present disclosure may further comprise a substrate 109, a sealant 111 and a protective layer 112. Specifically, for the display area of the display device, as shown in FIG. 1, the substrate 109 is disposed on a side of the color film 108 away from the liquid crystal layer 102. For the non-display area of the display device, as shown in FIG. 3, the substrate 109 is disposed on a side of the first electrode away from the liquid crystal layer 102. The sealant 111 is disposed on two sides of the liquid crystal layer 102 and is configured to prevent the external environment from damaging the liquid crystal molecules. The protective layer 112 is located between the second electrode and the array substrate 104, and is configured to protect the array substrate. For example, the protective layer 112 may prevent external air from damaging a thin film transistor by contact, and prevent external force from squeezing the thin film transistor to cause it to break.

As shown in FIG. 1, the display area of the display device further includes a polarizing plate 110 disposed on a side of the substrate 109 away from the liquid crystal layer 102.

To enable the image sensor, the light source and the photodetector to better cooperate with one another, and make the acquired three-dimensional image more precise, in an exemplary embodiment, the distances between the light source, the image sensor and the photodetector may be set within a set range. For example, the distances between the three devices may be set to tens of microns.

Since the distances between the image sensor, the light source and the photodetector are very small, in practical applications, the mutual positional relationships between the three devices are generally not limited. In an exemplary embodiment, in order to enable light emitted by the light source and reflected back by the target object to be sufficiently received by the image sensor and the photodetector, the light source may be disposed between the image sensor and the photodetector in a direction parallel to the array substrate.

In practical applications, the display device may be provided with multiple groups of three-dimensional imaging devices, each group including an image sensor, a light source, and a photodetector.

Figure 7:
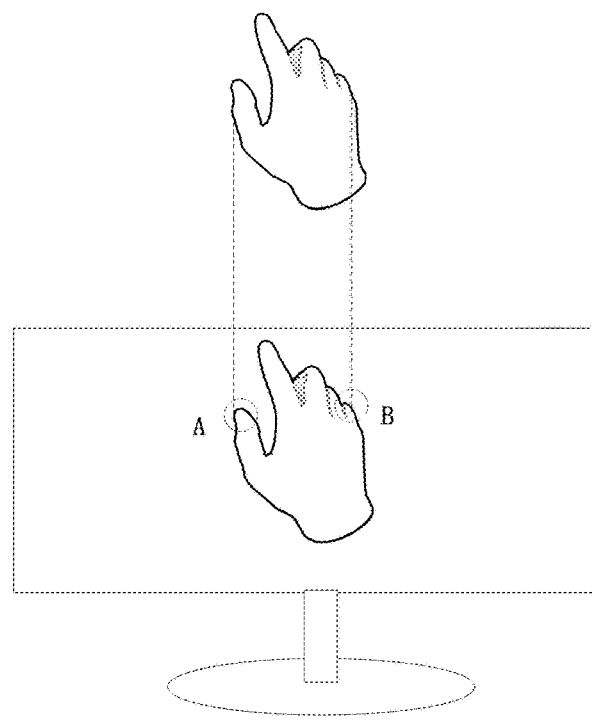
FIG. 7 is a schematic view showing that a display device provided by an embodiment of the present disclosure acquires a three-dimensional image of a user's hand.

FIG. 7 schematically illustrates the principle of acquiring a three-dimensional image according to the present disclosure. As shown in FIG. 7, a group of three-dimensional imaging devices is arranged at points A and B in the display device respectively for acquiring a partial three-dimensional image of a target object (e.g. hand) respectively. By integrating the image information acquired by the multiple groups of three-dimensional imaging devices in the display device, a complete three-dimensional image of the target object is finally presented on the display device.

In actual applications, the array substrate or the display device provided by embodiments of the present disclosure may be used for three-dimensional imaging. For example, in a virtual reality game, a user may be three-dimensionally imaged and displayed at a game interface so that the user can feel the game scene in an immersive manner. For another example, in a smart display device, according to the principle of acquiring a three-dimensional image of the target object in embodiments of the present disclosure, the trajectory of the target object can be tracked in real time, and corresponding functions are performed based on the trajectory of the target object, for example, the gesture recognition function and the like in a smart mobile phone.

Considering that the image sensor, the light source and the photodetector may be composed of a TFT (thin film transistor), respectively, these three devices may be prepared simultaneously with the TFTs for display as part of the TFT array in the process of practically preparing the array substrate or the display device provided by embodiments of the present disclosure. Therefore, the preparation method for the three devices is completely compatible with that for the thin film transistors used for driving the sub-pixels to emit light in the display device. Specifically, in preparing the display device, the three devices and the thin film transistors that drive the pixels to emit light are prepared simultaneously. Specific preparation methods include sputtering, chemical deposition, etching, and the like.

Various techniques may be described herein in the general context of a software/hardware component or program module. Generally, these modules include routines, programs, objects, elements, components, data structures, and the like that perform particular tasks or implement particular abstract data types. The terms "module" "function" and "component" used herein generally refer to software, firmware, hardware, or a combination thereof. The features of the techniques described herein are platform-independent, meaning that these techniques can be implemented on a variety of computing platforms having a variety of processors.

What have been described above are only part of the embodiments of the present disclosure. It is to be noted that those ordinarily skilled in the art may also make some improvements and embellishments without departing from the principle of the present disclosure. These improvements and embellishments should also be regarded as falling within the scope of the present disclosure.

The invention claimed is:

1. A display device comprising;
   an array substrate, comprising:
   a three-dimensional imaging device configured to acquire three-dimensional imaging information of a target object, wherein the three-dimensional imaging device comprises an image sensor, a light source, and a photodetector, wherein the light source is disposed between the image sensor and the photodetector in a direction parallel to the array substrate, wherein the light source is configured to emit light of a present wavelength to illuminate the target object, wherein the image sensor is configured to sense light emitted by the light source and reflected back by the target object, and generate two-dimensional image information based on sensed light, and wherein the photodetector is configured to receive light reflected back by the target object and generate a second electrical signal based on received light and
   a processing circuit connected to the three-dimensional imaging device, wherein the processing circuit is configured to instruct the light source to emit light of a preset wavelength, receive the two-dimensional image information and the second electrical signal from the image sensor and the photodetector respectively, determine depth information of the target object based on time at which the light is emitted and time at which the second electrical signal is received, and generate a three-dimensional image based on the depth information and the two-dimensional image information;

a liquid crystal layer stacked with the array substrate, wherein the liquid crystal layer comprises a plurality of first liquid crystal regions exactly opposite the image sensor, the light source or the photodetector, respectively;

spacers disposed between the plurality of first liquid crystal regions;

a first electrode on a side of the liquid crystal layer away from the array substrate; and a second electrode between the liquid crystal layer and the array substrate, wherein the processing circuit is configured to transmit a first electrical signal to the light source, and the light source is configured to emit light of the preset wavelength in response to receiving the first electrical signal, wherein the depth information of the target object is $c(T-t1-t2)/2$, where c is a propagation speed of light, T is a time interval from transmission of the first electrical signal to reception of the second electrical signal by the processing circuit, t1 is a time interval from reception of the first electrical signal to emission of light of the preset wavelength by the light source, and t2 is a time interval from reception of the light reflected back by the target object to output of the second electrical signal by the photodetector.

2. The display device according to claim 1, comprising a plurality of sub-pixels, wherein each of the plurality of sub-pixels includes a second liquid crystal region, and the display device further comprises a spacer disposed between adjacent first liquid crystal region and second liquid crystal region.

3. The display device according to claim 1, further comprising an upper alignment film and a lower alignment film.

4. The display device according to claim 3, wherein the upper alignment film is between the first electrode and the liquid crystal layer.

5. The display device according to claim 3, wherein the lower alignment film is between the second electrode and the liquid crystal layer.

6. The display device according to claim 3, wherein the second electrode is disposed in the lower alignment film.

7. The display device according to claim 3, wherein the first electrode is a strip electrode, and the first electrode is disposed in the upper alignment film.

8. The display device according to claim 1, further comprising a color film, wherein the color film is disposed on a side of the first electrode away from the liquid crystal layer, and includes a black matrix, the three-dimensional imaging device and the processing circuit are disposed in a display area, an orthographic projection of the black matrix on the array substrate at least partially overlaps the three-dimensional imaging device, and the black matrix has a light-transmissive hole, and an orthographic projection of the light-transmissive hole on the array substrate at least partially overlaps the three-dimensional imaging device.

9. The display device according to claim 1, wherein the three-dimensional imaging device is disposed in a non-display area on periphery of a display area of the display device.

10. The display device according to claim 1, further comprising a substrate, a sealant and a protective layer, wherein the substrate is disposed on a side of the first electrode away from the liquid crystal layer, the sealant is disposed on two sides of the liquid crystal layer in a direction parallel to the array substrate, and the protective layer is disposed between the second electrode and the array substrate and configured to protect the array substrate.

11. The display device according to claim 1, wherein distances between the light source, the image sensor, and the photodetector are set to tens of microns.

12. The display device according to claim 1, wherein the preset wavelength ranges from about 760 nm to about 1 mm.

* * * * *